United States Patent [19]
Lunn et al.

[11] Patent Number: 5,994,961
[45] Date of Patent: Nov. 30, 1999

[54] TEMPERATURE COMPENSATED DECIBEL LINEAR VARIABLE GAIN AMPLIFIER

[75] Inventors: Gerald Lunn, San Jose, Calif.; Ka Hung Derek Wong, Singapore, Singapore; Jeff Ortiz, Chandler, Ariz.; On Au-Yeung, Castle Green, Singapore

[73] Assignee: Motorola, Inc., Schaumburg, Ill.

[21] Appl. No.: 08/986,481

[22] Filed: Dec. 8, 1997

[51] Int. Cl.[6] .................................................. H03F 3/45
[52] U.S. Cl. ............................................ 330/254; 330/256
[58] Field of Search ..................................... 330/289, 256, 330/254, 278, 279

[56] References Cited

U.S. PATENT DOCUMENTS

| | | | |
|---|---|---|---|
| 3,942,191 | 3/1976 | Berrod et al. | 330/289 |
| 4,101,841 | 7/1978 | Okada et al. | 330/289 |
| 4,323,854 | 4/1982 | Hester | 330/289 |
| 5,132,632 | 7/1992 | Russel et al. | 330/289 |
| 5,471,173 | 11/1995 | Moore et al. | 330/256 |
| 5,471,654 | 11/1995 | Okazaki et al. | 330/289 |

*Primary Examiner*—Robert Pascal
*Assistant Examiner*—Khanh Van Nguyen
*Attorney, Agent, or Firm*—Rennie W. Dover

[57] ABSTRACT

A gain control signal (VCTRL) is provided to a temperature compensating circuit (12) which produces a differential temperature compensating gain control signal (VDT). A gain compensating circuit (14) receives the differential temperature compensating gain control signal (VDT) and provides a differential gain and temperature compensating gain control signal (VDTG) to an amplifier (16). The differential gain and temperature compensating gain control signal (VDTG) varies the gain of the amplifier (16) to be substantially linear with respect to variation of the gain control signal (VCTRL) and to compensate for variation in temperature.

10 Claims, 3 Drawing Sheets

TEMPERATURE COMPENSATED DECIBEL LINEAR VARIABLE GAIN AMPLIFIER

FIELD OF THE INVENTION

This invention relates to temperature compensated decibel linear variable gain amplifiers and particularly to an electronic variable gain amplifier (VGA) having a gain response in decibels which is linear in relation to a gain control signal, and which is temperature compensated.

BACKGROUND OF THE INVENTION

Electronic variable gain amplifiers (VGA) that provide a decibel linear gain response in relation to a gain control signal are known. Such a VGA has an input for receiving a signal and an output for providing the input signal amplified by the gain of the VGA which is determined by a gain control signal.

In operation, one requirement of the VGA is that its gain response in decibels be linear with respect to the level of the gain control signal. While this can be accomplished when the VGA is operating at relatively low gain, when a higher gain is required the gain of the VGA in decibels can become non-linear in relation to the level of the gain control signal. This occurs because beyond a certain gain, the gain of the amplifier begins to reduce or roll off. Another requirement of the VGA is that its gain response in decibels versus the level of the gain control signal be less sensitive to variations in temperature.

One method of obtaining a linear relationship between the gain in decibel and the gain control signal was disclosed in U.S. Pat. No. 4,816,772 by Klotz where feedback is employed to generate a conditioned control voltage.

A disadvantage of this method is that there is no effective temperature compensation. Another disadvantage is the need for good matching between the stages to avoid discontinuities in the gain versus gain control signal characteristic of the VGA.

BRIEF SUMMARY OF THE INVENTION

The present invention therefore seeks to provide a variable gain amplifier that is temperature compensated, uses relatively simple circuitry, and provides a continuous gain versus gain control signal characteristic.

Accordingly, in one aspect the invention provides a gain control circuit comprising a temperature compensating/linearizing signal conditioner that receives an unconditioned gain control signal and provides a conditioned gain control signal that: linearizes the variation of the gain of an amplifier in decibels with respect to changes of the unconditioned gain control signal; and compensates the gain of the amplifier to substantially reduce the effect of variation of the gain of the amplifier caused by variation in temperature.

In another aspect the invention provides a gain control circuit comprising: an amplifier having: a signal input; an amplified signal output; a gain control input; a temperature compensating/linearizing signal conditioner having an unconditioned gain control signal input; and a conditioned gain control signal output coupled to the amplifier gain control input.

In yet another aspect the invention provides a gain control circuit comprising: an amplifier circuit having an input coupled to receive a signal, a gain control input coupled to receive a conditioned signal, and an output that provides an output signal amplified in accordance with the conditioned signal; and a signal conditioning circuit having an input coupled to receive a gain control signal and having an output coupled to provide the conditioned signal, wherein the conditioned signal changes the gain of the amplifier circuit in decibel substantially linearly with respect to change in the gain control signal and wherein the conditioned signal changes the gain of the amplifier to compensate for variation in temperature.

BRIEF DESCRIPTION OF THE DRAWINGS

An embodiment of the invention will now be more fully described, by way of example, with reference to the drawings, of which.

DETAILED DESCRIPTION OF THE DRAWINGS

Figure 1:
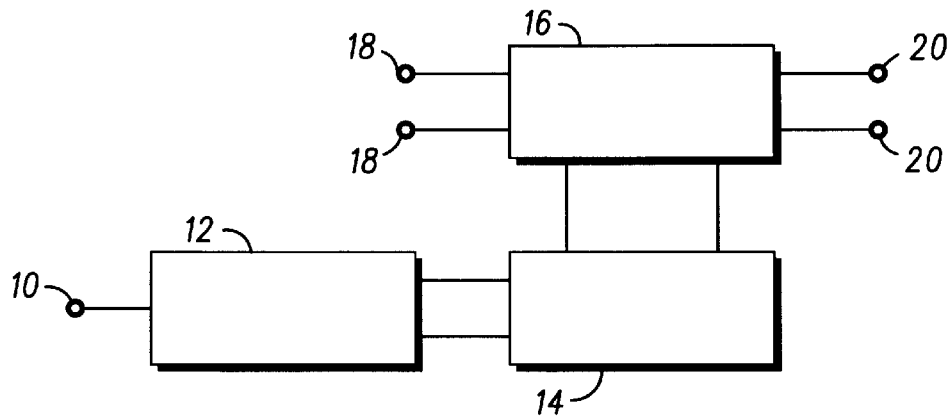
FIG. 1 shows a block diagram of an amplifier circuit.

FIG. 1 shows an input terminal 10 coupled to a temperature compensating circuit 12 which is coupled to a gain compensating circuit 14. The gain compensating circuit 14 is coupled to an amplifier 16, which is coupled to a pair of input terminals 18 and a pair of output terminals 20. A gain control signal provided to the input terminal 10 is received by the temperature compensating circuit 12 which provides a differential temperature compensating gain control signal to the gain compensating circuit 14. In response, the gain compensating circuit 14 provides a conditioned signal, which is a differential gain and temperature compensating gain control signal, to the amplifier circuit 16. The conditioned signal sets the gain of the amplifier 16 which amplifies an input signal provided between the input terminals 18 in accordance with the set gain, and provides the amplified signal between the output terminals 20.

The temperature compensating circuit 12 introduces a temperature varying element into the gain control signal, and produces the temperature compensating gain control signal. The temperature varying element compensates for variations in the amplifier's 16 gain versus gain control input characteristics caused by variation in temperature.

Similarly, the gain compensating circuit 14 introduces a gain varying element into the temperature compensating gain control signal, and produces the conditioned signal. The gain varying element compensates for variations in the amplifier's 16 gain response with respect to the gain control signal to extend the linear gain response of the amplifier 16 in decibels in relation to the gain control signal.

Figure 2:
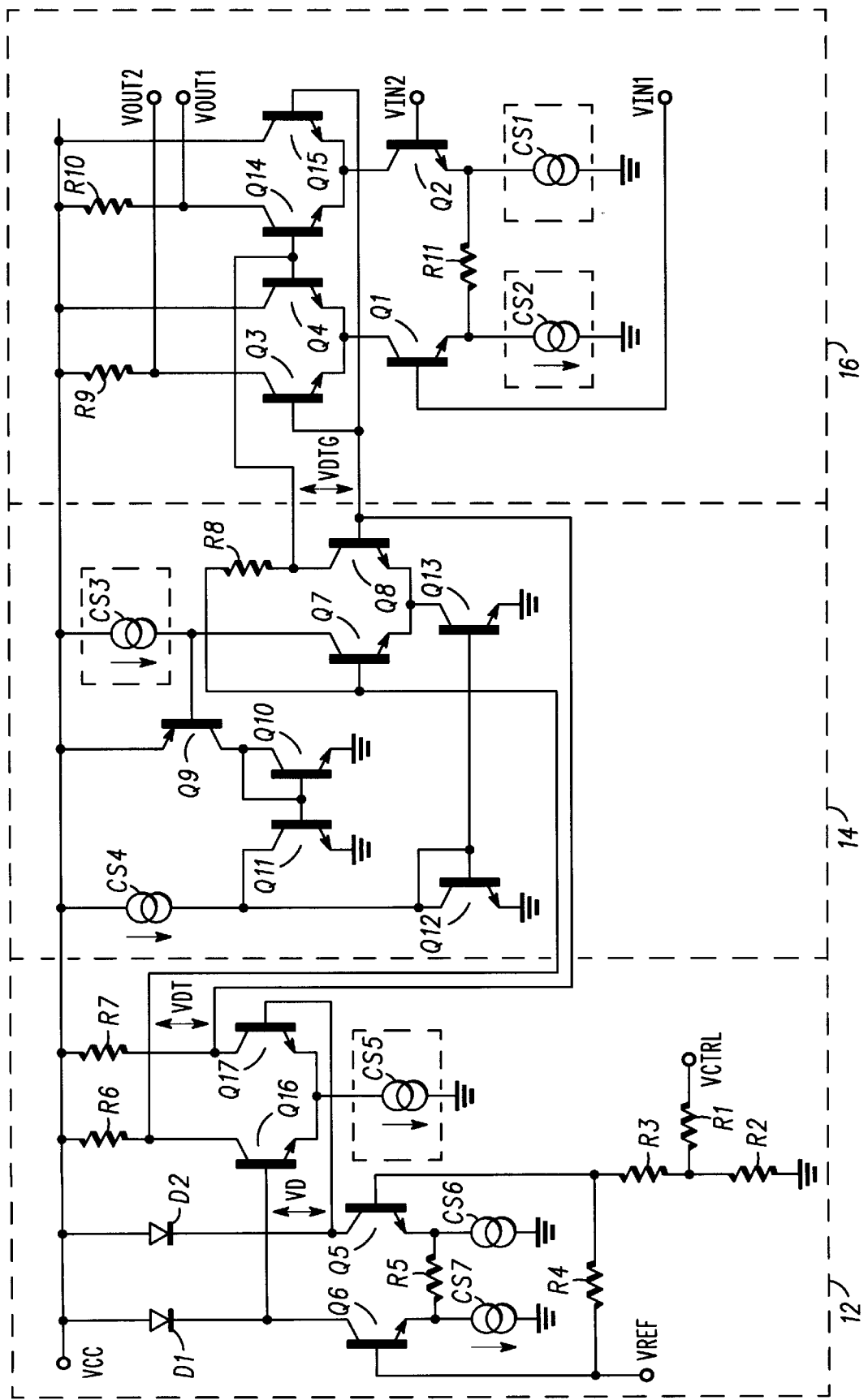
FIG. 2 shows a circuit diagram of the amplifier circuit in FIG. 1.

In FIG. 2 the temperature compensating circuit 12 includes diode D1 having an anode coupled to supply rail VCC and a cathode coupled to the collector of transistor Q6. Another diode D2 has an anode coupled to supply rail VCC and a cathode coupled to the collector of transistor Q5.

An input that receives a gain control signal VCTRL is coupled to the junction of series resistors R2 and R3 via resistor R1. A differential signal VD is produced between the collectors of transistors Q5 and Q6 and indicates the difference between the voltages at the bases of transistors Q5 and Q6. This configuration of transistors Q5 and Q6, constant current sources CS6 and CS7, and resistor R5 can also be referred to as a voltage to current converter. The function of diodes D1 and D2 is to provide a pre-distorted differential signal VD to the bases of transistors Q16 and Q17.

The temperature compensating circuit 12 also includes transistors Q16 and Q17, the emitters of which are coupled together to a proportional to absolute temperature (PTAT) current reference CS5. Transistors Q16 and Q17 are configured as a differential amplifier. An output signal VDT− is provided from the collector of transistor Q16, and another output signal VDT+ is provided from the collector of transistor Q17. A differential temperature compensating gain control signal VDT is produced between the two signals VDT− aid VDT+.

The gain compensating circuit 14 includes constant current source CS4 which is coupled between supply rail VCC and the collector of transistor Q12. A PTAT current reference CS3 is coupled between supply rail VCC and the base of transistor Q9. The base of transistor Q7 is coupled to the collector of Q16 to receive the output signal VDT−, and resistor R8 is coupled between the base of transistor Q7 and the collector of transistor Q8. The base of Q8 is coupled to the collector of Q17 to receive the output signal VDT+. Transistors Q7 and Q8 are also configured as a differential amplifier.

In this way, the differential temperature compensating gain control signal VDT is provided from the temperature compensating circuit 12 to the gain compensating circuit 14. In response, the gain compensating circuit 14 provides a conditioned signal VDTG, which is a differential gain and temperature compensating gain control signal, to the amplifier 16.

The amplifier circuit 16 is a differential current divider. PTAT current sources CS1 and CS2 are coupled between the emitters of transistors Q2 and Q1 and electrical ground GND, respectively. The bases of transistors Q4 and Q14 and the collector of transistor Q8 are connected together, and the bases of Q3, Q15 and Q8 are connected together. In this way the conditioned signal VDTG is provided to the amplifier circuit 16.

An input signal $V_{IN}$ is provided between input terminals VIN1 and VIN2. Output terminal VOUT1 is coupled to the collector of transistor Q14 and output terminal VOUT2 is coupled to the collector of transistor Q3. An output signal $V_{OUT}$ is provided between output terminals VOUT1 and VOUT2.

The amplifier 16 is a differential current divider type with variable gain which provides a wide gain control range. When the input signal $V_{IN}$ is applied across the bases of transistors Q1 and Q2, an input current $I_{IN}$ flows through the collector of Q1, and causes an output current $I_{OUT}$ to flow through the collector of Q3.

Now, consider the amplifier 16 when used in a conventional VGA application. Conventionally, the gain control voltage VCTRL is provided to prior art circuitry that provides a differential gain control signal $V_{DFG}$ which is then applied across the bases of transistors Q3 and Q4. The relationship between $I_{OUT}$, $I_{IN}$ and $V_{DFG}$ is given by the following equation.

$$I_{OUT} = \frac{I_{IN}}{1 + \exp(-V_{DFG}/VT)} \quad (1)$$

where, $I_{OUT}$ = collector current of transistor $Q3$ in Amperes;

$I_{IN}$ = collector current of transistor $Q1$ in Amperes;

$V_{DFG}$ = voltage of differential gain control signal in Volts;

$VT$ = $kT/Q$ and is referred to as the thermal voltage in volts, where $k$ = Boltzmann's constant, $T$ = temperature in degrees Kelvin, and $Q$ = electronic charge in Coulomb.

When the voltage of the differential gain control signal $V_{DFG}$ is negative i.e. the voltage at the base of transistor Q3 is less than the voltage at the base of transistor Q4, and the magnitude of the differential gain control signal $V_{DFG}$ is greater than the thermal voltage i.e. $|V_{DFG}|>>VT$, then the following equation holds true.

$$I_{OUT} = \frac{I_{IN}}{\exp(|V_{DFG}|/VT)} \quad (2)$$

Consequently, the relationship between the gain of the amplifier 16 in decibel and the differential gain control signal $V_{DFG}$ is linear. However, the differential gain control signal $V_{DFG}$ needs to be approximately 100 mV for this approximation to hold true, and at that level the amplifier 16 is already in high attenuation. As the differential gain control signal $V_{DFG}$ becomes more positive, the gain of the amplifier 16 increases but a point is reached when the gain of the amplifier 16 in decibel versus the differential gain control signal $V_{DFG}$ relationship will not be linear, and instead, the gain of the amplifier 16 will start to reduce or roll off.

Figure 3:
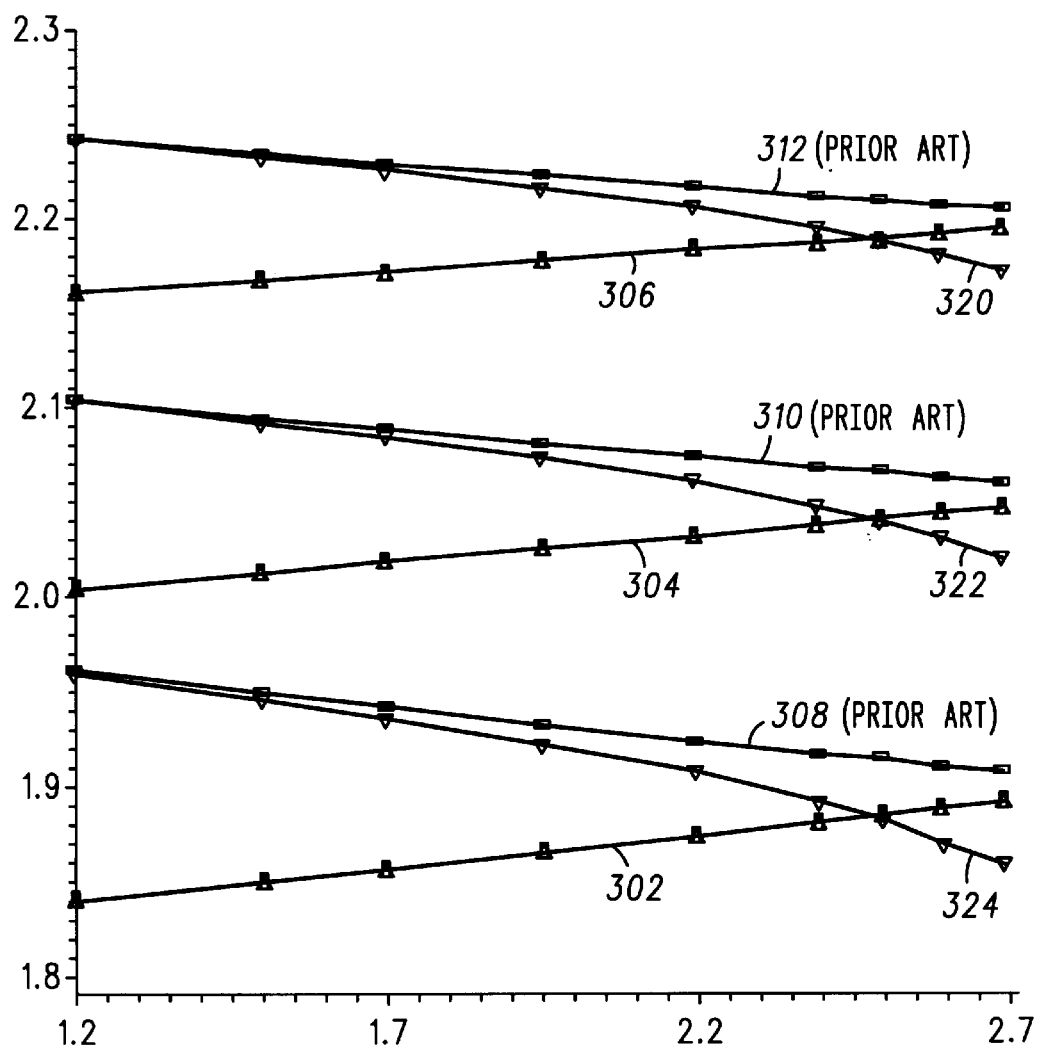
FIG. 3 is a graph showing a comparison between prior art amplifier characteristics and the characteristics of the amplifier circuit in FIG. 1.

With additional reference to FIG. 3 the X-axis represents the voltage of the gain control signal VCTRL and the Y-axis represents the voltages on the bases of transistors Q4 and Q14 and the bases of transistors Q3 and Q15. Each of the graphs 308, 310 and 312 represent the reducing ramp voltage on the bases of transistors Q4 and 014 across a range of operating temperatures. Similarly, each of the graphs 302, 304 and 306 represent the increasing ramp voltage on the bases of transistors Q3 and Q15 across a range of operating temperatures.

The differential gain control signal $V_{DFG}$ is the difference in voltage between a pair of increasing and reducing voltages, for example graphs 306 and 312 make up one pair at a first temperature of −30° C., graphs 304 and 310 make up another pair at a second temperature of 27° C., and graphs 302 and 308 make up yet another pair at a third temperature of 85° C. As can be seen all the graphs are linear throughout the range of voltages of the gain control signal VCTRL at each of the operating temperatures.

Figure 4:
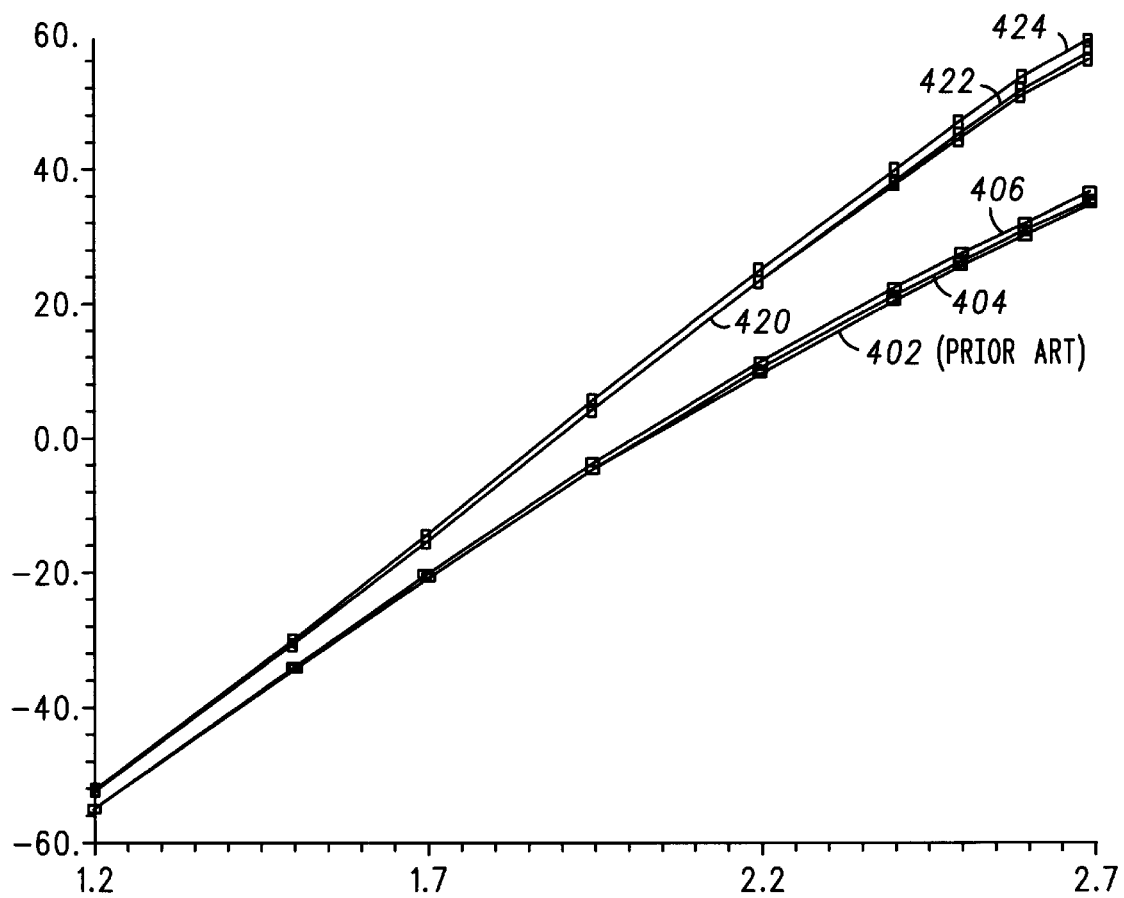
FIG. 4 is another graph showing a comparison between prior art amplifier characteristics and the characteristics of the amplifier circuit in FIG. 1.

Now with further reference to FIG. 4, the X-axis here represents the voltage of the gain control signal VCTRL, as before, and the Y-axis represents the gain of the amplifier 16 in decibel. The graphs 402, 404 and 406 correspond to the gain of the amplifier 16 when the differential gain control signal $V_{DFG}$ is that represented by the pairs of graphs 306 and 312, 304 and 310, and 302 and 308, respectively. As can be seen, the graphs 402, 404 and 406 show that between approximately −55 decibels to 34 decibels the gain of the amplifier 16 is linear.

The present invention advantageously provides gain compensation or correction when the amplifier 16 is operating at high gain to extend the linear-in-decibel relationships between the gain of the amplifier 16 and the gain control signal VCTRL while preserving the linear-in-decibel relationships at low gain. Further, the linear-in-decibel relationship between the gain of the amplifier 16 and the gain control signal VCTRL is substantially independent of temperature variation.

In accordance with the present invention, and referring once again to FIG. 2, the gain of the amplifier 16 is controlled by the gain control signal VCTRL which varies from zero to 2.7V. The gain control signal VCTRL is provided to the temperature compensating circuit 12 where it is scaled down by resistors R1, R2, R3 and R4 and then provided to the base of transistor Q5 as a control signal $VCTRL_{Q5}$. When the voltage of the gain control signal VCTRL increases from zero to 2.7V, the voltage of the control signal $VCTRL_{Q5}$ at the base of transistor Q5 increases from a predetermined minimum voltage to a predetermined maximum voltage. The predetermined maximum voltage is made less than the reference voltage VREF of 2.1 volts applied to the base of transistor Q6.

The output of the temperature compensating circuit 12 is the differential temperature compensating gain control signal VDT. The relationship between the voltage across the bases of transistors Q5 and Q6 and the differential temperature compensating gain control signal VDT that is produced is given by the following equation.

$$VDT = (R7/R5)*(I_{CS5}/I_{CS7})*(VREF - VCTRL_{Q5}) \quad (3)$$

where, $I_{CS5}$ = current in amperes provided by current reference CS5;

$I_{CS7}$ = current in amperes provided by constant current source CS7;

VREF = reference voltage of 2.1 volts; and $VCTRL_{Q5}$ = voltage at the base of transistor Q5.

When the voltage of the gain control signal VCTRL increases, the voltage of the output signal VDT− on the collector of transistor Q16 decreases linearly whereas the voltage of the output signal VDT+ on the collector of the transistor Q17 increases linearly. Plotting the voltages of the output signals VDT− and VDT+ on the collectors of Q16 and Q17 against VCTRL, results in a pair of line graphs (e.g. 304 and 310) that cross each other when $VCTRL_{Q5}$ equals VREF. This can be seen in FIG. 3 where it is apparent that at some point, as the gain control voltage VCTRL increases, the pair of line graphs will cross.

The differential temperature compensating gain control signal VDT generated by the temperature compensating circuit 12 is made proportional to absolute temperature to provide temperature compensation in the amplifier 16. This is done by making the current $I_{CS5}$ provided by the current reference CS5 vary in proportion to absolute temperature. In the temperature compensating circuit 12, this is accomplished using a bandgap reference current generator.

The output signals VDT− and VDT+ of the temperature compensating circuit 12 are provided to the bases of transistors Q7 and Q8, respectively, in the gain compensating circuit 14. The output signal VDT− also serves as the supply rail for transistor Q8 through resistor R8. In a preferred embodiment, the output signal VDT− is buffered. Transistors Q7 and Q8 form a differential pair, and the current reference CS3, which is coupled to the collector of transistor Q7, provides a reference current IREF which varies in proportion to absolute temperature.

A feedback loop formed by transistors Q9, Q10, Q11, Q12 and Q13 operates to maintain the level of collector current of transistor Q7 at IREF. The output signal VDT+ from the base of transistor Q8 and an output signal VDTG− from the collector of transistor Q8 is provided to the amplifier 16. The signal formed between the output signals VDT+ and VDTG− is the differential gain and temperature compensating gain control signal or conditioned signal VDTG.

When the voltage of the output signal VDT− is much greater than the voltage of the output signal VDT+, the collector current of transistor Q8 is negligible. Consequently, the voltage of the output signal VDTG− is equal to the voltage of the output signal VDT− because the voltage drop across resistor R8 is negligible. The gain compensating circuit 14 is then said to be inactive.

However, when the voltage of the output signal VDT− decreases and approaches VDT+, the gain compensating circuit 14 starts to become effective. The voltage of the output signal VDTG− is then equal to the voltage of the output signal VDT− reduced by the voltage drop across R8. The voltage drop can tie arrived at using the following equation.

$$\text{Voltage drop across } R8 = IREF * R8 * \exp(VDT/VT) \quad (4)$$

where,

IREF = current in Amperes provided by current reference CS3;

R8 = resistance in Ohms;

VDT = differential temperature compensating gain control signal in Volts; and

VT = $kT/Q$ and is referred to as the thermal voltage in volts, where $k$ = Boltzmann's constant, $T$ = temperature in degrees Kelvin, and $Q$ = electronic charge in Coulombs.

The reduction in the voltage of the output signal VDT− results in a decrease in voltage of the output signal VDTG− which causes the gain of the amplifier 16 to increase. The effect of reducing the voltage of the output signal VDT− is shown in FIG. 3 by graphs 320, 322 and 324 at −30° C., 27° C. and 85° C., respectively.

This increased gain extends the linearity-in-decibels of the gain of the amplifier 16 with respect to the gain control signal VCTRL. The increased range of the linearity of the gain of the amplifier 16 is shown in FIG. 4 by graphs 420, 422 arid 424 at −30° C., 27° C. and 85° C., respectively, and extends from −56 decibels to 56 decibels. The gain of the amplifier 16 can be determined by using a modified form of equation (1) as follows.

$$I_{OUT} = \frac{I_{IN}}{1 + \exp(-(VDT + IREF * R8 * \exp(VDT/VT))/VT)} \quad (5)$$

where, $I_{OUT}$ = collector current of transistor Q3 in Amperes;

$I_{IN}$ = collector current of transistor Q1 in Amperes;

IREF = current in Amperes provided by current reference CS3;

R8 = resistance in Ohms;

VDT = differential temperature compensating gain control signal in Volts;

VT = $kT/Q$ and is referred to as the thermal voltage in volts, where k = Boltzmann's constant, T = temperature in degrees Kelvin, and Q = electronic charge in Coulombs.

In addition, when the voltage of the differential temperature compensating gain control signal VDT is negative, and the magnitude of the differential temperature compensating gain control signal VDT is much greater than the thermal voltage VT i.e. |VDT|>>VT, then the gain of the amplifier 16 given by the equation (5) reduces to the equation (2).

However, if the differential temperature compensating gain control signal VDT is equal to zero i.e. VDT=0, then the equation (5) becomes the equation that follows.

$$I_{OUT} = \frac{I_{IN}}{1 + \exp(-IREF * R8 / VT)} \quad (6)$$

where, $I_{OUT}$ = collector current of transistor Q3 in Amperes;

$I_{IN}$ = collector current of transistor Q1 in Amperes;

IREF = current in Amperes provided by current reference CS3;

R8 = resistance in Ohms;

VT = $kT/Q$ and is referred to as the thermal voltage in volts, where k = Boltzmann's constant, T = temperature in degrees Kelvin, and Q = electronic charge in Coulombs.

When VDT=0, according to equation (1), the current $I_{OUT}$ is given by $I_{IN}/2$ resulting in a decrease in gain of three decibels when no gain compensation is provided. However, with the gain compensating circuit 14 in accordance with the present invention, in equation (5), when VDT=0, $I_{OUT}$ increases, thus, the gain of the amplifier 16 is boosted. In the equation (5), the values of IREF and R8 set the degree of gain correction or compensation. The product of IREF and R8 should be chosen for optimal linearity between the gain in decibels of the amplifier 16 and the gain control voltage VCTRL. If the values of IREF and R8 that are chosen are too large, this will result in over-compensation and the portion of the gain curve at high gain will convex upwards.

In a preferred embodiment, the output signals VDT+ and VDTG− are buffered before being provided to the bases of transistors Q3 and Q4, respectively, however the use of buffers causes a difficulty at start-up i.e. when power is first supplied between supply rail VCC and electrical ground GND.

When the buffer is used to buffer the output signal VDT+, the voltage of the output signal VDT+ provided by the buffer may be much greater than the voltage of the output signal VDT− at start-up. Due to the exponential relationship between the collector current of transistor Q8 and the differential temperature compensating gain control signal VDT, a substantial base current will flow through transistor Q8. If this base current exceeds the driving capability of the buffer, the buffer output voltage will not rise to the expected value. To prevent this from occurring a constant current source CS4 is used to perform the function of a current limiter at start-up. The constant current source CS4 limits the collector current of transistor Q13 which in turns limits the base current of transistor Q8.

Turning now to temperature compensation, in accordance with the present invention, in equation (5) temperature compensation has three parts. Firstly, we generate the differential temperature compensating gain control signal VDT that is proportional to absolute temperature. This is done by the temperature compensating circuit 12 as explained previously. Secondly, IREF is made proportional to absolute temperature. And thirdly, as $I_{IN}$ is generated by the input signal $V_{IN}$ applied across the bases of transistors Q1 and Q2, in order to reduce the temperature effect caused by the thermal voltage VT, the current reference CS2 is made proportional to absolute temperature. In circuit, this is accomplished by a bandgap reference current generator.

The relation between $I_{IN}$ and $V_{IN}$ is given by the following equation.

$$I_{IN} = \frac{1}{(VT/CS2) + R11/2} * \frac{V_{IN}}{2} \quad (7)$$

where, $I_{IN}$ = collector current of transistor Q3 in Amperes;

$V_{IN}$ = voltage applied across the bases of transistors Q1 and Q2;

VT = $kT/Q$ and is referred to as the thermal voltage in volts, where k = Boltzmann's constant, T = temperature in degrees Kelvin, and Q = electronic charge in Coulombs; and CS2 = current reference in Amperes proportional to absolute temperature; and R11 = degenerated resistors across the emitters of transistors Q1 and Q2 in Ohms.

Hence, the described circuit advantageously extends the linearity of the gain of an amplifier in decibel to be continuous in relation to a gain control signal. This is accomplished by conditioning a gain control signal such that the conditioned gain control signal compensates the gain of the amplifier when the amplifier is operating at high gain. In addition, the conditioned gain control signal also compensates the gain of the amplifier for variations in temperature.

The present invention therefore provides a variable gain amplifier having an extended linear amplification range and having a continuous gain control characteristic which is temperature compensated.

We claim:

1. A gain control circuit comprising:
   a bipolar amplifier comprising:
      a plurality of transistors;
      a signal input coupled to at least one of the plurality of transistors;
      an amplified signal output coupled to at least one of the plurality of transistors;
      a gain control input coupled to a base of at least one of the plurality of transistors;
   a temperature compensator circuit means having an unconditioned gain control signal input, the temperature compensator circuit means for receiving an unconditioned gain control signal and providing a temperature compensating signal which effects change in the gain of the bipolar amplifier to substantially compensate for temperature variations; and
   a gain compensator circuit means coupled to the temperature compensator circuit means, the gain compensator circuit means for receiving the temperature compensating signal, and the gain compensator circuit means having a conditioned gain control signal output coupled to the bipolar amplifier gain control input, the gain compensator circuit means for providing a conditioned gain control signal which changes the gain of the bipolar amplifier in decibels substantially linearly with respect to change of the unconditioned gain control signal.

2. A gain control circuit in accordance with claim 1 wherein the bipolar amplifier comprises an electronic variable gain amplifier circuit.

3. A gain control circuit in accordance with claim 2 wherein the electronic variable gain amplifier comprises a differential current divider variable gain amplifier circuit.

4. A gain control circuit comprising:
   an amplifier circuit having an input coupled to receive a signal, a gain control input coupled to receive a conditioned gain control signal, and an output that provides an output signal amplified in accordance with the conditioned gain control signal;
   at least two identical constant current sources having an input coupled to receive an unconditioned gain control signal and having an output coupled to provide a temperature compensating signal which effects change in the gain of the amplifier circuit to substantially compensate for temperature variations; and
   a gain compensator circuit having an input coupled to the output of the at least two identical constant current sources to receive the temperature compensating signal and having an output to provide the conditioned gain control signal which changes the gain of the amplifier circuit in decibels substantially linearly with respect to change of the unconditioned gain control signal.

5. A gain control circuit comprising:
   an amplifier circuit having an input coupled to receive a signal, a gain control input coupled to receive a conditioned gain control signal, and an output that provides an output signal amplifier in accordance with the conditioned gain control signal;
   at least one current reference circuit that provides a predetermined reference current which is proportional to absolute temperature, the at least one current reference circuit having an input coupled to receive an unconditioned gain control signal and having an output coupled to provide a temperature compensating signal which effects change in the gain of the amplifier circuit to substantially compensate for temperature variations; and
   a gain compensator circuit having an input coupled to the output of the at least one current reference circuit, the gain compensator circuit for receiving the temperature compensating signal and having an output to provide the conditioned gain control signal which changes the gain of the amplifier circuit in decibels substantially linearly with respect to change of the unconditioned gain control signal.

6. A gain control circuit in accordance with claim 5 wherein the at least one current reference circuit comprises a bandgap device.

7. A gain control circuit comprising:
   an amplifier circuit having inputs coupled to receive first and second input signals, a gain control input coupled to receive a conditioned gain control signal, and an output that provides first and second output signals amplified in accordance with the conditioned signal;
   a temperature compensator circuit having an input coupled to receive an unconditioned gain control signal and having an output coupled to provide a temperature compensating signal which effects change in the gain of the amplifier circuit to substantially compensate for temperature variations;
   a first transistor having a collector coupled to receive a reference current, a base coupled to receive the first input signal, and an emitter;
   a second transistor having a collector coupled to a resistor which is coupled to receive the first input signal and wherein the collector is coupled to provide the first output signal, the second transistor having a base coupled to receive the second input signal and provide the second output signal, and having an emitter coupled to the emitter of the first transistor; and
   a feedback circuit having a first input coupled to the first supply rail, a second input coupled to a second supply rail, an output coupled to the collector of the first transistor, and a feedback terminal coupled to the emitter of the first transistor, the feedback circuit for regulating the emitter current of the first transistor so that the collector current thereof is maintained at a level equal to the reference current,
   wherein when the voltage of the first input signal is greater than the voltage of the second input signal the voltage of the first output signal is substantially equal to the voltage of the first input signal, and
   wherein when the voltage of the first input signal becomes substantially equal to the voltage of the second input signal the voltage of the first output signal is substantially equal to the voltage of the first input signal less the voltage drop across the resistor.

8. A circuit in accordance with claim 9 wherein the collector of the first transistor is coupled to at least one reference current circuit that provides the reference current which is proportional to absolute temperature.

9. A circuit in accordance with claim 8 wherein the at least one current reference circuit comprises a bandgap device.

10. A circuit in accordance with claim 7 wherein the feed back circuit comprises at least one constant current source to limit current flowing between the first and second supply rails when power is applied therebetween.

* * * * *